United States Patent
Hikawa et al.

(10) Patent No.: US 12,087,562 B2
(45) Date of Patent: Sep. 10, 2024

(54) SUBSTRATE PROCESSING APPARATUS, SUBSTRATE PROCESSING SYSTEM, AND ABNORMALITY DETECTION METHOD

(71) Applicant: Tokyo Electron Limited, Tokyo (JP)

(72) Inventors: Kazushi Hikawa, Nirasaki (JP); Katsuhito Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 304 days.

(21) Appl. No.: 17/586,002

(22) Filed: Jan. 27, 2022

(65) Prior Publication Data
US 2022/0251705 A1 Aug. 11, 2022

(30) Foreign Application Priority Data
Feb. 5, 2021 (JP) ................. 2021-017299

(51) Int. Cl.
*H01J 37/32* (2006.01)
*C23C 16/455* (2006.01)
*C23C 16/505* (2006.01)
*H05H 1/46* (2006.01)

(52) U.S. Cl.
CPC .. *H01J 37/32935* (2013.01); *C23C 16/45536* (2013.01); *C23C 16/505* (2013.01); *H01J 37/32082* (2013.01); *H05H 1/4645* (2021.05)

(58) Field of Classification Search
None
See application file for complete search history.

(56) References Cited

U.S. PATENT DOCUMENTS

| | | | | |
|---|---|---|---|---|
| 9,200,950 B2* | 12/2015 | Lian | ........... | G01J 1/0488 |
| 2002/0006876 A1* | 1/2002 | Hongo | ........... | H01L 21/68728 |
| | | | | 156/345.12 |
| 2003/0117613 A1* | 6/2003 | Audouin | ........... | H04B 10/07953 |
| | | | | 356/73.1 |
| 2004/0213565 A1* | 10/2004 | Kamalov | ........... | H04B 10/07953 |
| | | | | 398/26 |
| 2005/0095774 A1* | 5/2005 | Ushiku | ........... | G05B 19/41885 |
| | | | | 438/222 |
| 2006/0252283 A1* | 11/2006 | Takeda | ........... | H01J 37/32174 |
| | | | | 438/798 |
| 2008/0029483 A1* | 2/2008 | Ventzek | ........... | H01L 21/0273 |
| | | | | 156/345.35 |

(Continued)

FOREIGN PATENT DOCUMENTS

JP 2003-257699 A 9/2003
JP 2006-253364 A 9/2006
(Continued)

*Primary Examiner* — Srinivas Sathiraju
(74) *Attorney, Agent, or Firm* — Armstrong Teasdale LLP

(57) ABSTRACT

A substrate processing apparatus includes a radio-frequency power supply part configured to supply radio-frequency power for plasma generation to a processing container, and a monitoring part configured to detect an abnormality in the supply of the radio-frequency power to the processing container, wherein the monitoring part is configured to detect the abnormality in the supply of the radio-frequency power to the processing container based on a signal data obtained by sampling a signal propagating between the radio-frequency power supply part and the processing container at a sampling frequency higher than a frequency of the radio-frequency power.

8 Claims, 9 Drawing Sheets

(56) References Cited

U.S. PATENT DOCUMENTS

| | | | | |
|---|---|---|---|---|
| 2008/0032507 A1* | 2/2008 | Ventzek | H01L 21/0273 257/E21.026 |
| 2008/0038926 A1* | 2/2008 | Ventzek | H01J 37/32082 156/345.35 |
| 2008/0040061 A1* | 2/2008 | Osada | H01J 37/32935 702/82 |
| 2008/0288217 A1* | 11/2008 | Akao | G01D 9/005 702/187 |
| 2009/0186483 A1* | 7/2009 | Saito | H01J 37/32935 438/689 |
| 2010/0042012 A1* | 2/2010 | Alhussiny | A61B 5/30 600/546 |
| 2011/0141650 A1* | 6/2011 | Fujisawa | H01L 21/6732 361/234 |
| 2013/0214828 A1* | 8/2013 | Valcore, Jr. | H01J 37/32174 327/141 |
| 2015/0042987 A1* | 2/2015 | Bills | G01N 21/47 356/237.2 |
| 2015/0241272 A1* | 8/2015 | Lian | G01J 1/0488 250/206 |
| 2017/0314130 A1* | 11/2017 | Hirose | C23C 16/34 |
| 2018/0108518 A1* | 4/2018 | Noro | C23C 16/4586 |
| 2019/0080926 A1* | 3/2019 | Talone | H01L 21/30604 |
| 2019/0131116 A1 | 5/2019 | Wu et al. | |
| 2019/0302174 A1* | 10/2019 | Ghantasala | G01R 19/0061 |
| 2020/0299841 A1* | 9/2020 | Hirose | C23C 16/515 |
| 2020/0328100 A1* | 10/2020 | Hirose | G05B 19/41865 |
| 2022/0208520 A1* | 6/2022 | Zhang | H03H 7/40 |
| 2022/0251705 A1* | 8/2022 | Hikawa | C23C 16/45536 |
| 2022/0344129 A1* | 10/2022 | Kapoor | H01J 37/32926 |

FOREIGN PATENT DOCUMENTS

| | | |
|---|---|---|
| JP | 2010-504614 A | 2/2010 |
| JP | 2014-199736 A | 10/2014 |
| JP | 2017-162713 A | 9/2017 |
| KR | 10-2003-0073343 A | 9/2003 |
| KR | 10-2016-0027343 A | 3/2016 |
| KR | 10-2016-0033034 A | 3/2016 |
| WO | 2020025546 A1 | 2/2020 |

* cited by examiner

Without filter

With filter

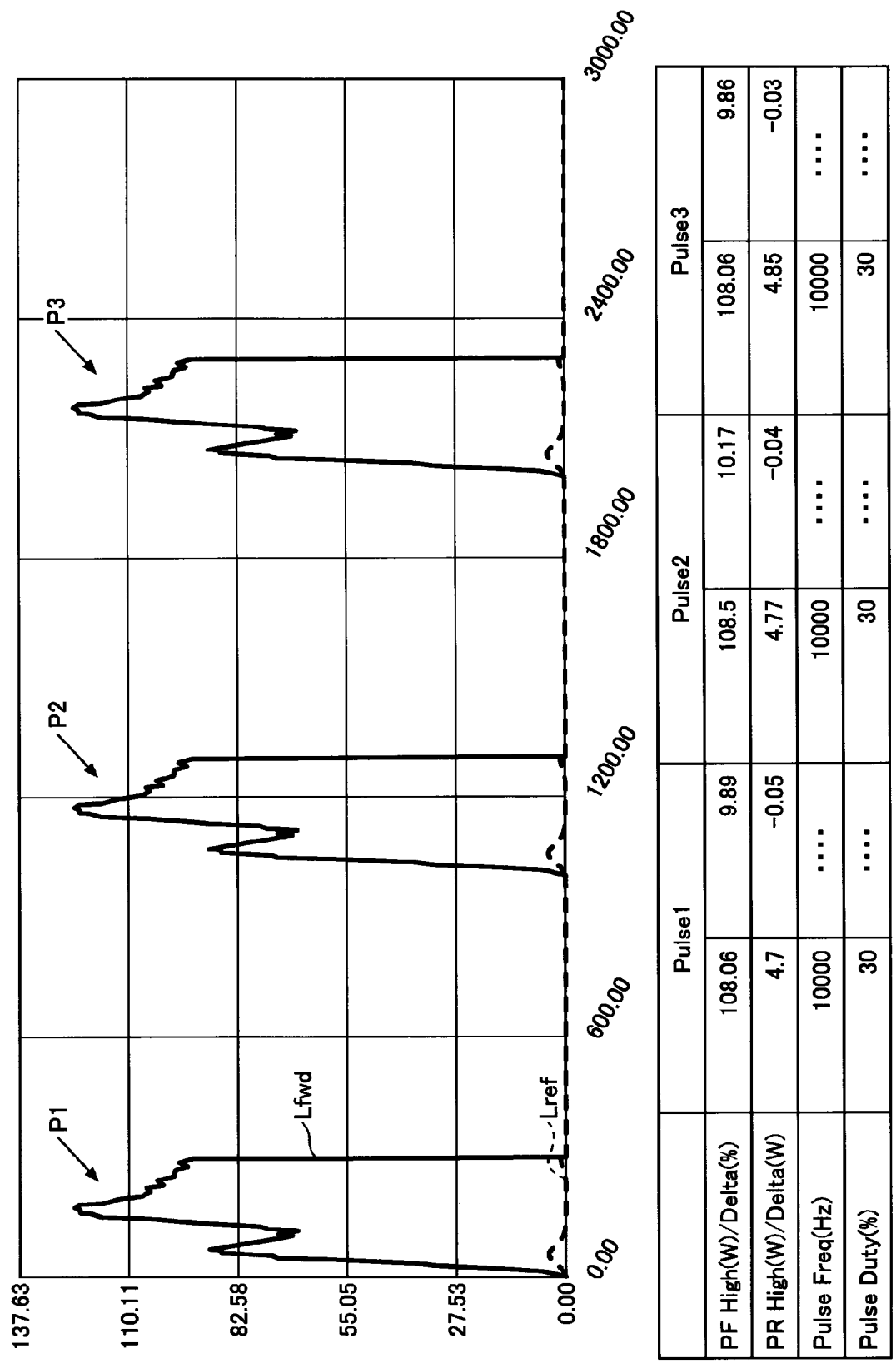

US 12,087,562 B2

SUBSTRATE PROCESSING APPARATUS, SUBSTRATE PROCESSING SYSTEM, AND ABNORMALITY DETECTION METHOD

CROSS-REFERENCE TO RELATED APPLICATION

This application is based upon and claims the benefit of priority from Japanese Patent Application No. 2021-017299, filed on Feb. 5, 2021, the entire contents of which are incorporated herein by reference.

TECHNICAL FIELD

The present disclosure relates to a substrate processing apparatus, a substrate processing system, and an abnormality detection method.

BACKGROUND

Patent Document 1 discloses a circuit configuration for monitoring and adjusting a pulse RF bias voltage signal applied to a chuck inside a plasma chamber in which a semiconductor wafer is processed. Patent Document 1 discloses that the circuit configuration includes an RF bias voltage detector for detecting an individual pulse of the pulse RF bias voltage signal applied to the chuck.

Patent Document 2 discloses a radio-frequency power supply device for a plasma generator including a modulation part for generating intermittent radio-frequency outputs based on a modulation reference signal and a peak value setting signal. Patent Document 2 discloses that an average value of the intermittent radio-frequency outputs is calculated based on a peak set value and a duty ratio set value preset by a pulse generation part, and a modulation reference signal is generated based on the average value of the radio-frequency outputs and an average value of the radio-frequency outputs calculated by a calculation part.

PRIOR ART DOCUMENTS

Patent Documents

Patent Document 1: Japanese Laid-Open Patent Publication No. 2010-504614

Patent Document 2: Japanese Laid-Open Patent Publication No. 2003-257699

SUMMARY

According to one embodiment of the present disclosure, a substrate processing apparatus includes a radio-frequency power supply part configured to supply radio-frequency power for plasma generation to a processing container, and a monitoring part configured to detect an abnormality in the supply of the radio-frequency power to the processing container, wherein the monitoring part is configured to detect the abnormality in the supply of the radio-frequency power to the processing container based on a signal data obtained by sampling a signal propagating between the radio-frequency power supply part and the processing container at a sampling frequency higher than a frequency of the radio-frequency power.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a view illustrating an operation of an example of the substrate processing apparatus according to the present embodiment.

DETAILED DESCRIPTION

Figure 1:
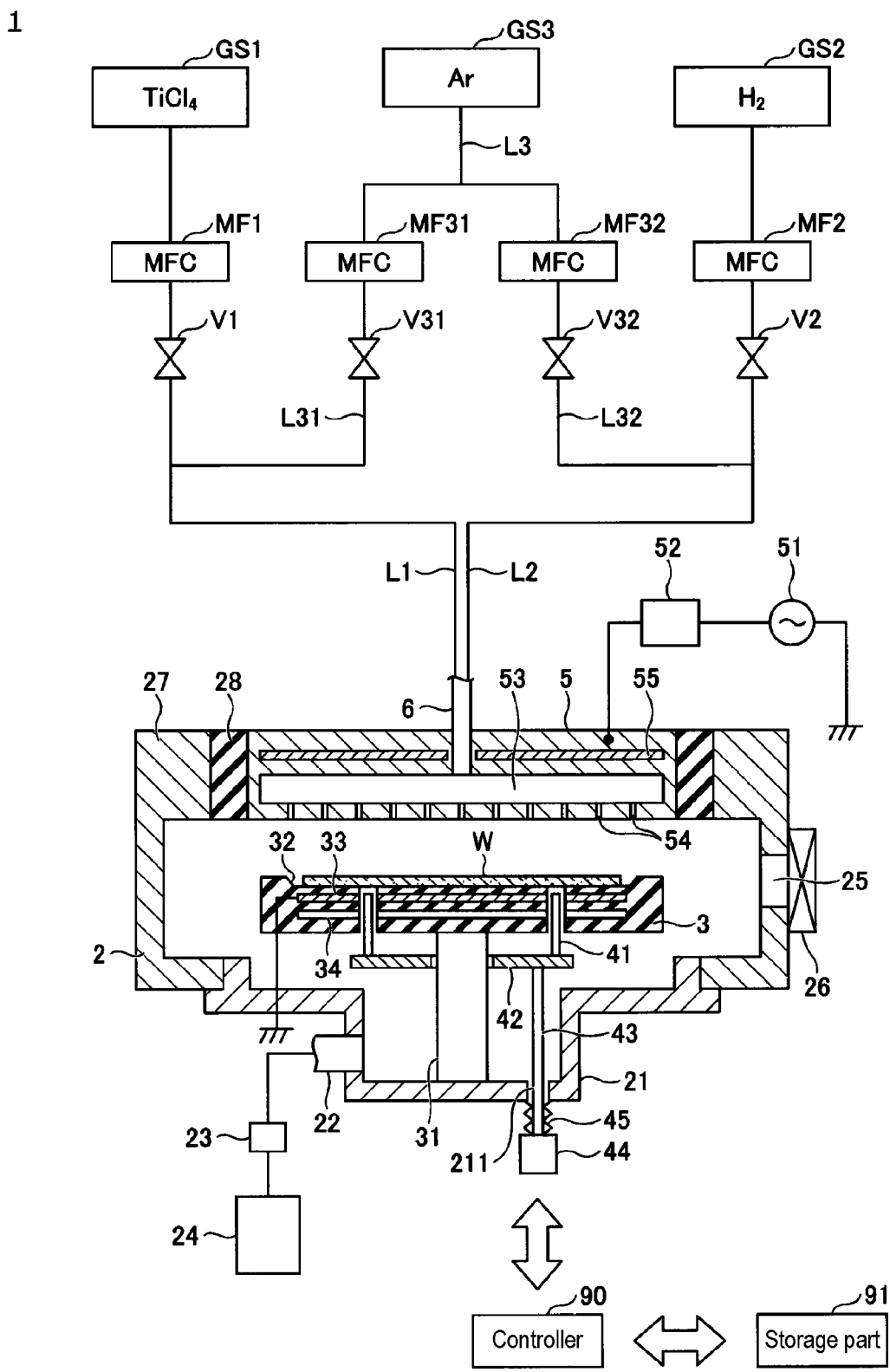
FIG. 1 is a schematic cross-sectional view of an example of a substrate processing apparatus according to an embodiment.

Hereinafter, embodiments for carrying out the present disclosure will be described with reference to drawings. In the specification and drawings, substantially the same constituent elements will be denoted by the same reference numerals, and redundant descriptions thereof will be omitted. In order to facilitate understanding, the scale of each part in the drawings may differ from the actual scale. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the directions of parallel, right angle, orthogonal, horizontal, vertical, up/down, left/right, and the like, a deviation that does not impair the effect of an embodiment is allowed. The shape of a corner portion is not limited to a right angle, and may be rounded in a bow shape. The terms parallel, right-angled, orthogonal, horizontal, and vertical may include substantially parallel, substantially right-angled, substantially orthogonal, substantially horizontal, and substantially vertical.

<Substrate Processing Apparatus>

A configuration example of a substrate processing apparatus according to an embodiment of the present disclosure will be described. FIG. 1 is a cross-sectional view illustrating the configuration example of the substrate processing apparatus.

As illustrated in FIG. 1, the substrate processing apparatus 1 is a film forming apparatus that performs a process of forming a titanium (Ti) film on a semiconductor wafer (hereinafter referred to as a "wafer W"), which is, for example, a substrate, through a plasma CVD method. The substrate processing apparatus 1 includes a substantially cylindrical hermetically sealed processing container 2. An exhaust chamber 21 is provided at in the central portion of the bottom wall of the processing container 2.

The exhaust chamber 21 has, for example, a substantially cylindrical shape that protrudes downward. An exhaust passage 22 is connected to the exhaust chamber 21, for example, on the side surface of the exhaust chamber 21.

An exhaust part 24 is connected to the exhaust passage 22 via a pressure adjusting part 23. The pressure adjusting part 23 includes a pressure adjusting valve such as a butterfly valve. The exhaust passage 22 is configured such that the interior of the processing container 2 can be depressurized by the exhaust part 24.

A transfer port 25 is provided in the side surface of the processing container 2. The transfer port 25 is configured to be opened/closed by a gate valve 26. The loading/unloading of the wafer W between the interior of the processing container 2 and the transfer chamber (not illustrated) is performed via the transfer port 25.

Within the processing container 2, a stage 3 which is a substrate placement stage for holding the wafer W substantially horizontally is provided. The stage 3 is formed in a substantially circular shape in a plan view. The stage 3 is supported by a support member 31. A circular recess 32 in which the wafer W having a diameter of, for example, 300 mm is placed, is formed in the surface of the stage 3.

The stage 3 is formed of a ceramic material such as aluminum nitride (AlN). The stage 3 may be formed of a metal material such as nickel (Ni). Instead of the recess 32, a guide ring configured to guide the wafer W may be provided on the peripheral edge of the surface of the stage 3.

For example, a grounded lower electrode 33 is embedded in the stage 3. A heating mechanism 34 is embedded below the lower electrode 33. By being fed with power from a power supply part (not illustrated) based on a control signal from a controller 90, the heating mechanism 34 heats the wafer W placed on the stage 3 to a set temperature (e.g., a temperature of 350 to 700 degrees C.). When the entire stage 3 is made of metal, the entire stage 3 functions as a lower electrode, so that the lower electrode 33 does not have to be embedded in the stage 3.

The stage 3 is provided with a plurality of (e.g., three) lifting pins 41 configured to hold and raise/lower the wafer W placed on the stage 3. The material of the lifting pins 41 may be, for example, ceramic such as alumina ($Al_2O_3$), quartz, or the like. The lower ends of the lifting pins 41 are attached to a support plate 42. The support plate 42 is connected to a lifting mechanism 44 provided outside the processing container 2 via a lifting shaft 43.

The lifting mechanism 44 is installed, for example, under the exhaust chamber 21. A bellows 45 is provided between an opening 211 for the lifting shaft 43 formed in the bottom surface of the exhaust chamber 21 and the lifting mechanism 44. The shape of the support plate 42 may be a shape that can be raised and lowered without interfering with the support member 31 of the stage 3. The lifting pins 41 are configured to be raised/lowered by the lifting mechanism 44 between the upper side of the surface of the stage 3 and the lower side of the surface of the stage 3.

A gas supplier 5 is provided on a ceiling wall 27 of the processing container 2 via an insulating member 28. The gas supplier 5 forms an upper electrode and faces the lower electrode 33. A radio-frequency power supply 51 is connected to the gas supplier 5 via a matcher 52. By supplying radio-frequency power from the radio-frequency power supply 51 to the upper electrode (the gas supplier 5), a radio-frequency electric field is generated between the upper electrode (the gas supplier 5) and the lower electrode 33.

The gas supplier 5 includes a hollow gas supply chamber 53. In the bottom surface of the gas supply chamber 53, for example, a large number of holes 54 for dispersedly supplying a processing gas into the processing container 2 are evenly arranged. A heating mechanism 55 is embedded in the gas supplier 5, for example, at the upper side of the gas supply chamber 53. The heating mechanism 55 is heated to a set temperature with power fed from a power supply part (not illustrated) based on a control signal from the controller 90.

The gas supply chamber 53 is provided with a gas supply path 6. The gas supply path 6 communicates with the gas supply chamber 53. To the upstream side of the gas supply path 6, a gas source GS1 is connected via a gas line L1, and a gas source GS2 is connected via a gas line L2. A gas source GS3 is connected to the gas line L1 via a gas line L31 and a gas line L3. The gas source GS3 is connected to the gas line L2 via a gas line L32 and the gas line L3.

In the example of FIG. 1, the gas source GS1 is a gas source of $TiCl_4$, the gas source GS2 is a gas source of $H_2$, and the gas source GS3 is a gas source of Ar. However, the gas source GS1 may be a gas source of another metal raw-material (e.g., an organic raw-material containing $WCl_6$, $WCl_5$, $WF_6$, $TaCl_5$, or $AlCl_3$, which is a metal raw-material containing a halogen element, or Co, Mo, Ni, Ti, W, or Al,), the gas source GS2 may be a gas source of another reducing gas (e.g., $NH_3$, hydrazine, or monomethylhydrazine), and the gas source GS3 may be a gas source of another inert gas (e.g., $N_2$, He, Ne, Kr, or Xe).

In addition, the gas line L1 and the gas line L2 are connected to each other between the valve V1 and the gas supply path 6 in the gas line L1 and between the valve V2 and the gas supply path 6 in the gas line L2.

The gas source GS1 is connected to the gas supply path 6 via the gas line L1. A flow rate controller MF1 and a valve V1 are provided in the gas line L1 in this order from the side of the gas source GS1. By providing the flow rate controller MF1 and the valve V1 in this order from the side of the gas source GS1, $TiCl_4$ supplied from the gas source GS1 is supplied to the gas supply path 6 in the state in which the flow rate thereof is controlled by the flow rate controller MF1.

The gas source GS2 is connected to the gas supply path 6 via the gas line L2. A flow rate controller MF2 and a valve V2 are provided in the gas line L2 in this order from the side of the gas source GS2. Since the flow rate controller MF2 and the valve V2 are provided in this order from the side of the gas source GS2, $H_2$ supplied from the gas source GS2 is supplied to the gas supply path 6 in the state in which the flow rate thereof is controlled by the flow rate controller MF2.

The gas source GS3 is connected between the valve V1 in the gas line L1 and the gas supply path 6 via the gas line L3 and the gas line L31. A flow rate controller MF31 and a valve V31 are provided in the gas line L31 in this order from the side of the gas source GS3. Since the flow rate controller MF31 and the valve V31 are provided in this order from the side of the gas source GS3, the flow rate of Ar supplied from the gas source GS3 is controlled by the flow rate controller MF31. Ar having the flow rate controlled by the flow rate controller MF31 is supplied to the gas line L1 and supplied to the gas supply path 6 in the state of being mixed with TiCl$_4$ flowing through the gas line L1.

The gas source GS3 is connected between the valve V2 in the gas line L2 and the gas supply path 6 via the gas line L3 and the gas line L32. A flow rate controller MF32 and a valve V32 are provided in the gas line L32 in this order from the side of the gas source GS3. Since the flow rate controller MF32 and the valve V32 are provided in this order from the side of the gas source GS3, the flow rate of Ar supplied from the gas source GS3 is controlled by the flow rate controller MF32. Ar having the flow rate controlled by the flow rate controller MF32 is supplied to the gas line L2 and supplied to the gas supply path 6 in the state of being mixed with H$_2$ flowing through the gas line L2.

With this configuration, it is possible to supply Ar, which is supplied from the gas source GS3, to the gas line L1 and the gas line L2 while controlling the flow rates thereof by the flow rate controller MF31 and the flow rate controller MF32, respectively.

The substrate processing apparatus 1 includes the controller 90 and a storage part 91. The controller 90 includes a CPU, RAM, ROM, and the like (all not illustrated). The controller 90 comprehensively controls the substrate processing apparatus 1 by causing the CPU to execute, for example, a computer program stored in the ROM or the storage part 91.

Figure 2:
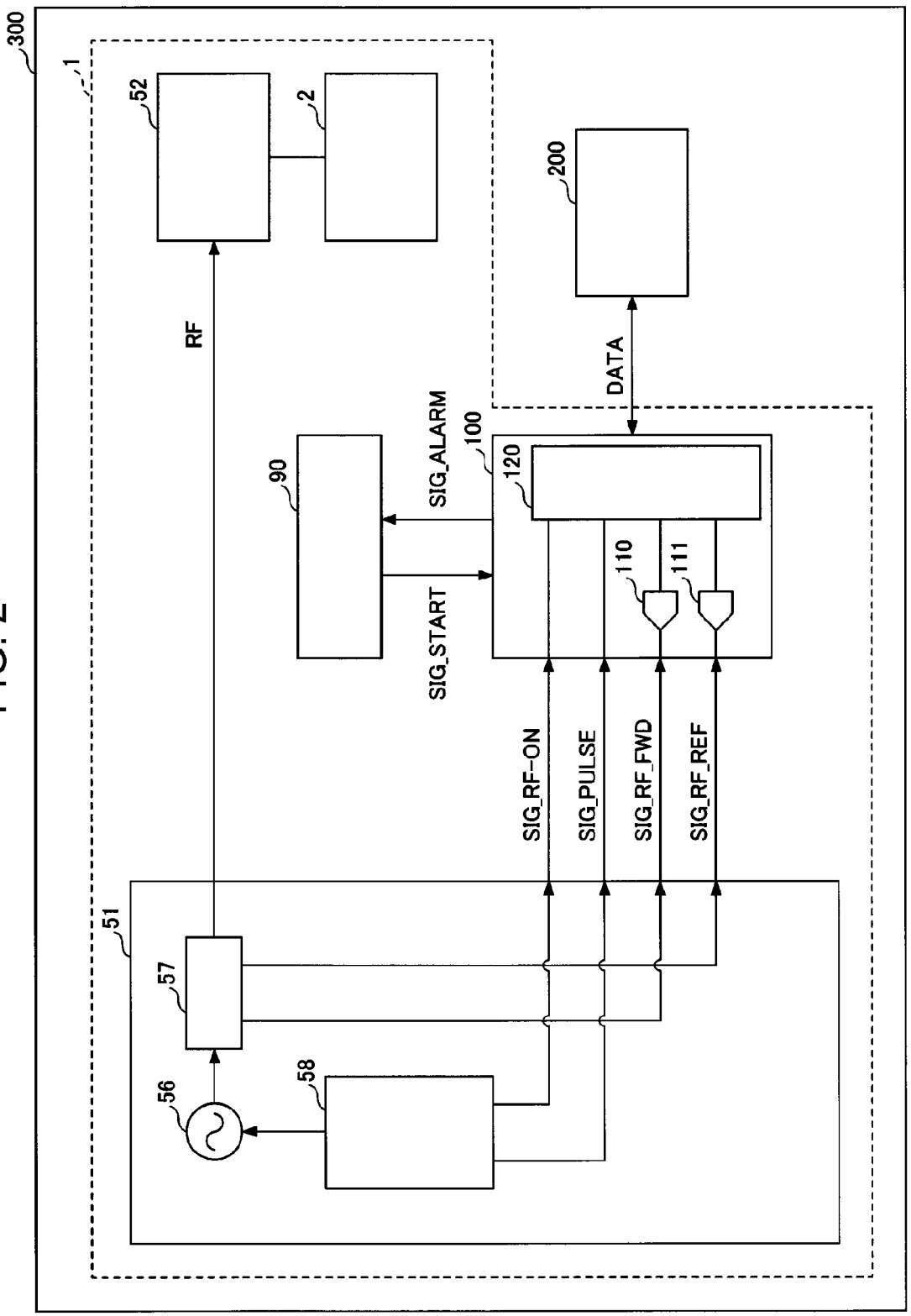
FIG. 2 is a block diagram of a portion related to a radio-frequency power supply in an example of the substrate processing apparatus according to the present embodiment.

FIG. 2 is a block diagram of a portion related to the radio-frequency power supply 51 in an example of the substrate processing apparatus 1 according to the present embodiment.

The radio-frequency power supply 51 includes a radio-frequency generator 56, a bidirectional coupler 57, and a power supply controller 58.

The radio-frequency generator 56 generates radio-frequency power for generating plasma, that is, radio-frequency power for plasma generation. The radio-frequency generator 56 generates radio-frequency power in a pulse shape. That is, the radio-frequency generator 56 alternately repeats the period for generating radio-frequency power and the period for cutting off the radio-frequency power.

For example, the radio-frequency generator 56 generates radio-frequency power which is a sine wave and has a fundamental frequency of 450 kHz. In addition, the radio-frequency generator 56 generates radio-frequency power in a period of 20 microseconds to 50,000 microseconds (an output period), and cuts off the radio-frequency power in a subsequent period of 20 microseconds to 100 microseconds (a stop period). Then, the radio-frequency generator 56 alternately repeats the generation of the radio-frequency power and the cut-off of the radio-frequency power. That is, the radio-frequency generator 56 operates with a cycle of 1 microsecond and a duty ratio of 17 to 99% (=a period for outputting radio-frequency power/(a period for outputting radio-frequency power+a period for cutting off radio-frequency power)).

The radio-frequency generator 56 is connected to the power supply controller 58. The power supply controller 58 controls the radio-frequency generator 56. The power supply controller 58 may change, for example, the fundamental frequency, the repetition frequency, and the duty ratio of the radio-frequency power output by the radio-frequency generator 56.

The fundamental frequency of radio-frequency power is not limited to the frequency of 450 kHz. For example, the fundamental frequency of radio-frequency power may be a frequency included in the range of 350 kHz or more and 550 kHz or less.

The bidirectional coupler 57 is provided between the radio-frequency generator 56 and the matcher 52. The bidirectional coupler 57 outputs radio-frequency power input from the radio-frequency generator 56, to the matcher 52 as a signal RF. In addition, a portion of the radio-frequency power input from the radio-frequency generator 56 is output as a signal SIG_RF_FWD to a pulse monitor 100 to be described later. In addition, the radio-frequency power input from the matcher 52 to the bidirectional coupler 57 is output to the pulse monitor 100 as a signal SIG_RF_REF.

The power supply controller 58 controls the radio-frequency generator 56. The power supply controller 58 outputs, to the pulse monitor 100, a signal SIG_RF-ON indicating that the radio-frequency power supply 51 is outputting radio-frequency power and a signal SIG_PULSE indicating that a pulse is being generated.

The pulse monitor 100 monitors whether radio-frequency power is being appropriately supplied from the radio-frequency power supply 51 to the upper electrode (the gas supplier 5) based on the radio-frequency signal input from the radio-frequency power supply 51. Specifically, the pulse monitor 100 monitors whether radio-frequency power is being appropriately supplied from the radio-frequency power supply 51 to the upper electrode (the gas supplier 5) based on the signal SIG_RF_FWD input from the radio-frequency power supply 51 and the signal SIG_RF_REF related to the radio-frequency power input from the matcher 52 to the bidirectional coupler.

Figure 3A:
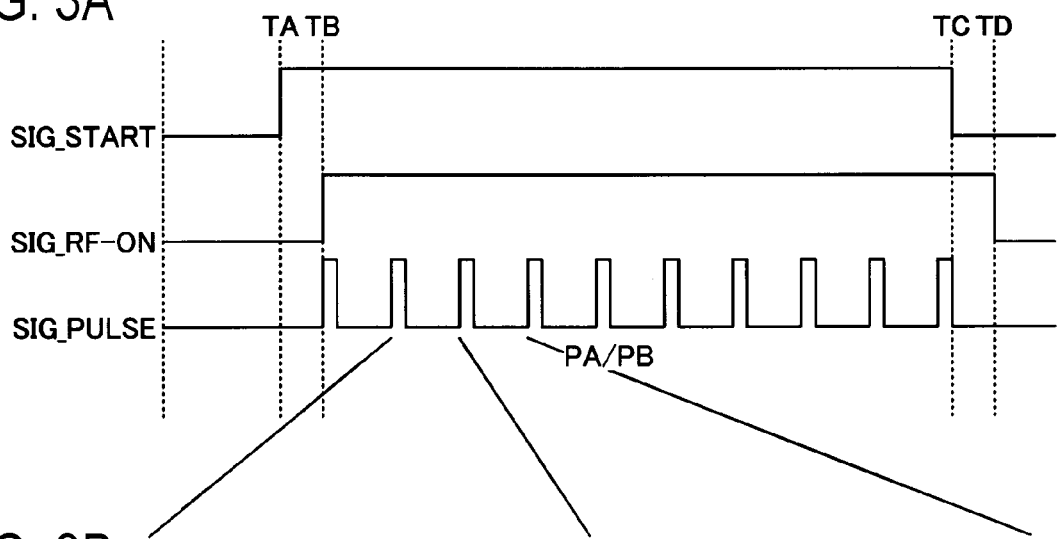
FIGS. 3A to 3C are views illustrating waveforms related to an example of the substrate processing apparatus according to the present embodiment.
Figure 3B:
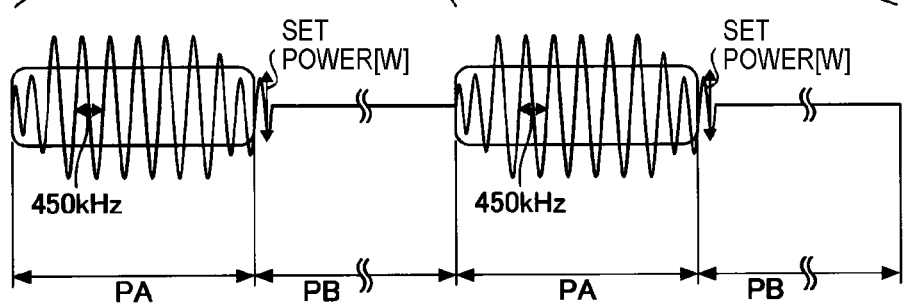
Figure 3C:
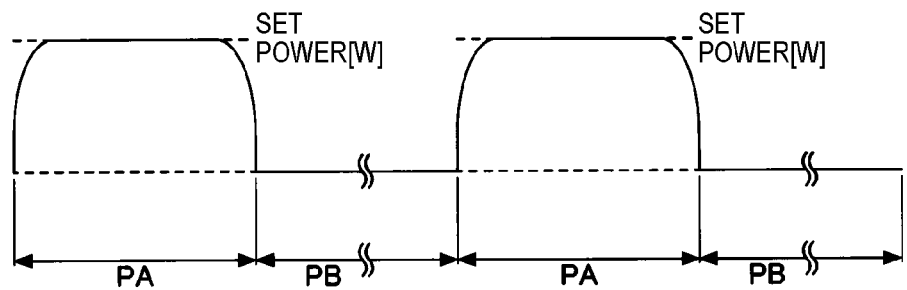

The signal processing performed in the pulse monitor 100 will be described. FIGS. 3A to 3C are views illustrating waveforms related to an example of the substrate processing apparatus 1 according to the present embodiment.

First, digital signals input to the pulse monitor 100 will be described. FIG. 3A illustrates waveforms of digital signals input to the pulse monitor 100. The controller 90 sets the signal SIG_START to a high level (time TA). When the signal SIG_START reaches the high level, the pulse monitor 100 starts operation.

When starting the supply of radio-frequency power, the radio-frequency power supply 51 sets the signal SIG_RF-ON to the high level. In addition, the radio-frequency power supply 51 sets the signal SIG_PULSE to the high level in synchronization with a signal pulse. As for the signal SIG_PULSE, a waveform having the high level for PA seconds and the low level for PB seconds is repeated.

When the signal SIG_RF-ON and the signal SIG_PULSE reach the high levels, the pulse monitor 100 starts an abnormality detection process (time TB). For example, when continuous discharge (supply of radio-frequency power that is not pulsed) is performed, since the signal SIG_PULSE is not shifted to the high level, the pulse monitor 100 does not perform the abnormality detection process.

In addition, when the operation of the pulse monitor 100 is stopped, the controller 90 sets the signal SIG_START to a low level (time TC). When the signal SIG_START is shifted to the low level, the pulse monitor 100 stops operating.

When the supply of radio-frequency power is stopped, the radio-frequency power supply 51 sets the signal SIG_RF-ON to the low level (time TD).

Next, an analog signal input to the pulse monitor 100 will be described. FIG. 3B illustrates a waveform of an analog signal input to the pulse monitor 100. Specifically, waveforms of analog signals input to the pulse monitor 100 are the signal SIG_RF_FWD and the signal SIG_RF_REF. FIG. 3B schematically illustrates the waveform of the signal SIG_RF_FWD.

The signal SIG_RF_FWD and the signal SIG_RF_REF mainly include a SIN wave having a frequency of 450 kHz in the period PA in which the signal SIG_PULSE is at the high level. For example, in the signal SIG_RF_FWD of FIG. 3B, the effective value of the SIN wave is, for example, 300 W. In the signal SIG_RF_FWD and the signal SIG_RF_REF, in the period PB in which the signal SIG_PULSE is at the low level, the effective values are almost equal to 0 W.

Next, a signal arithmetically operated by the pulse monitor 100 will be described. FIG. 3C illustrates a waveform of a signal arithmetically operated by the pulse monitor 100. The pulse monitor 100 forms a pulse obtained by converting the signal SIG_RF_FWD and the signal SIG_RF_REF into effective values. For example, in the case of the signal SIG_RF_FWD, the signal SIG_PULSE is turned into a pulse in which the effective value is SET_POWER in the period PA in which the signal SIG_PULSE is at the high level and the effective value is approximately 0 W in the period PB in which the signal SIG_PULSE is at the low level.

The pulse monitor 100 includes an analog-digital converter 110, an analog-digital converter 111, and a signal processing part 120.

The analog-digital converter 110 converts the signal SIG_RF_FWD, which is an analog signal, into a digital signal (signal data) at a first sampling frequency. The analog-digital converter 110 outputs the digitized signal SIG_RF_FWD to the signal processing part 120.

The analog-digital converter 111 converts the signal SIG_RF_REF, which is an analog signal, into a digital signal (signal data) at a second sampling frequency. The analog-digital converter 111 outputs the digitized signal SIG_RF_REF to the signal processing part 120.

The first sampling frequency and the second sampling frequency may be equal to or different from each other. Each of the first sampling frequency and the second sampling frequency is preferably 10 times or more, more preferably 20 times or more, and particularly preferably 50 times or more of the fundamental frequency of the radio-frequency generator 56.

Figure 4:
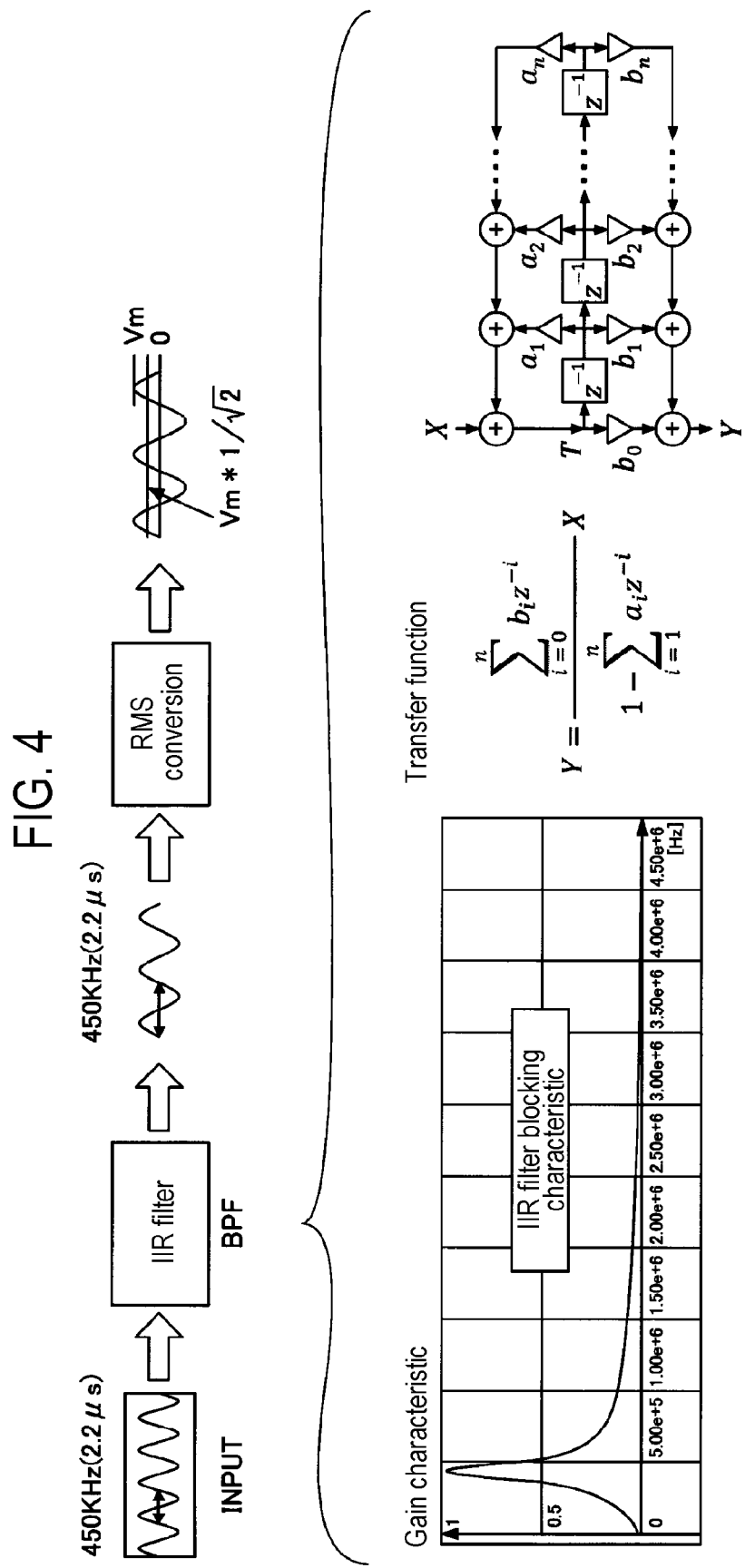
FIG. 4 is a view illustrating a signal processing in an example of the substrate processing apparatus according to the present embodiment.

The signal processing part 120 is, for example, a digital signal processor. The signal processing part 120 processes digital signals from the analog-digital converter 110 and the analog-digital converter 111. FIG. 4 illustrates a process performed in the signal processing part 120. FIG. 4 is a view illustrating a signal processing of an example of the substrate processing apparatus 1 according to the present embodiment.

The digitized signal SIG_RF_FWD and signal SIG_RF_REF (INPUT in FIG. 4) input from the radio-frequency power supply 51 are input to the signal processing part 120. The signal SIG_RF_FWD and the signal SIG_RF_REF include signals of many frequency components in addition to SIN waves having a frequency of 450 kHz (a period of 2.2 microseconds) of the radio-frequency power supplied by the radio-frequency generator 56.

The signal processing part 120 performs a filtering process in order to extract the SIN waves having a frequency of 450 kHz (a period of 2.2 microseconds) of radio-frequency power supplied by the radio-frequency generator 56. The signal processing part 120 performs the filter process with respect to each of the digitized signal SIG_RF_FWD and signal SIG_RF_REF input from the radio-frequency power supply 51. Specifically, the signal processing part 120 performs the filtering process with respect to the digitized signal SIG_RF_FWD and signal SIG_RF_REF using an infinite impulse response (IIR) filter.

The IIR filter is a band pass filter that uses the fundamental frequency of the radio-frequency generator 56 as the center frequency of the pass band. For example, assuming that the fundamental frequency is 450 kHz, the pass band of the IIR filter may be set to 400 kHz to 500 kHz for the signal SIG_RF_FWD. In addition, for the signal SIG_RF_REF, the pass band of the IIR filter may be set to 430 kHz to 470 kHz. In addition, the setting of the pass band may be changed in the range of 0 to 5 MHz.

Gain characteristics of the IIR filter and a transfer function of the IIR filter in the substrate processing apparatus 1 according to the present embodiment are illustrated at the lower side of FIG. 4. The order of the IIR filter is second order.

A signal that has passed through the IIR filter is converted into an effective value. The effective value is obtained by dividing the amplitude Vm by the square root of 2. In a root mean square (RMS) conversion block, a signal that has passed through the IIR filter is converted into an effective value.

Figure 5A:
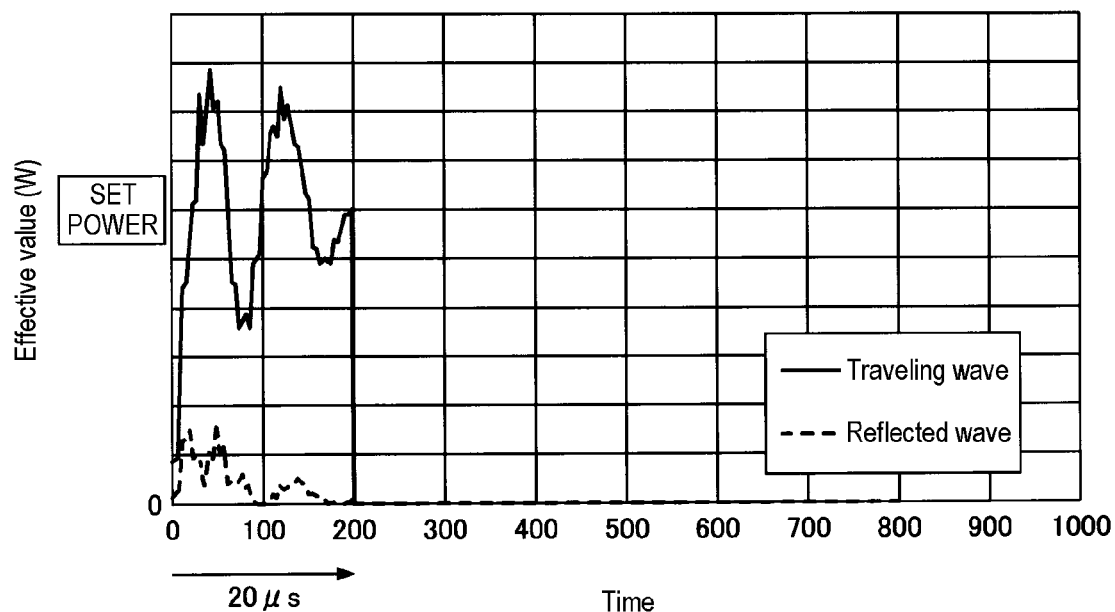
FIGS. 5A and 5B are views illustrating processing results in an example of the substrate processing apparatus according to the present embodiment.
Figure 5B:
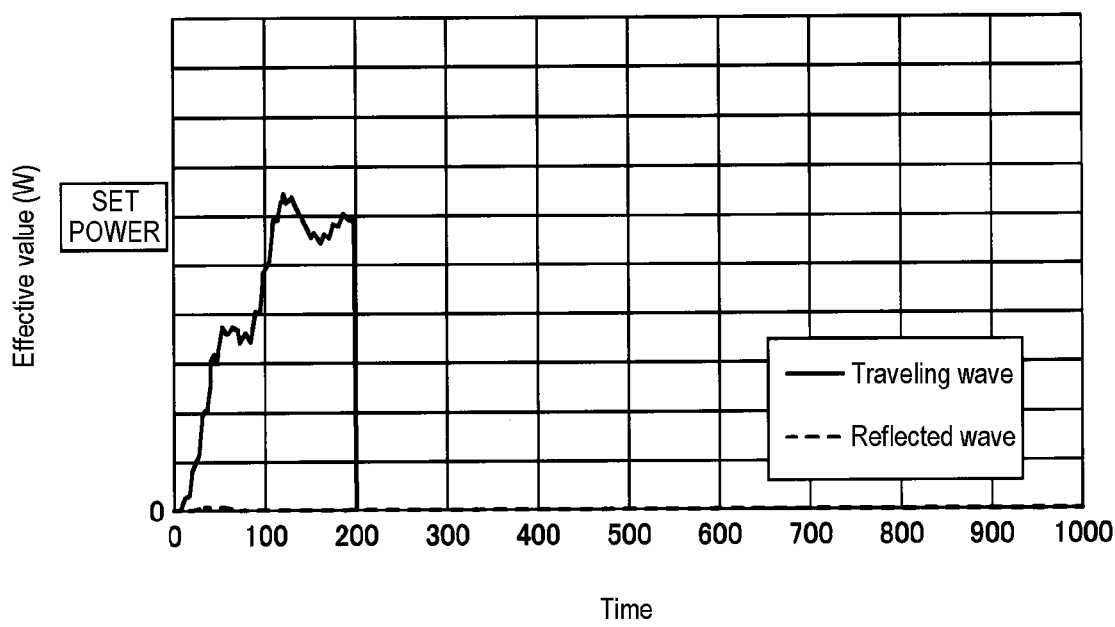

The effect of an IIR filter is illustrated in FIGS. 5A and 5B. FIG. 5A illustrates a result obtained by performing effective value conversion of the signal SIG_RF_FWD of the effective value of SET POWER without an IIR filter. FIG. 5B illustrates a result obtained by performing effective value conversion of the signal SIG_RF_FWD with an IIR filter. The horizontal axis represents time (unit: 0.1 microseconds), and the vertical axis represents an effective value.

When there was no IIR filter, effective values changed significantly, and in particular, values at which effective values exceeded SET POWER were detected. When there was no IIR filter, a waveform which is difficult to determine as a square wave was obtained. Meanwhile, by removing signals other than a frequency component of radio-frequency power by the IIR filter, it is possible to stably obtain a waveform having a value substantially close to SET POWER. When there was an IIR filter, the waveform became close to a square wave.

Figure 6:
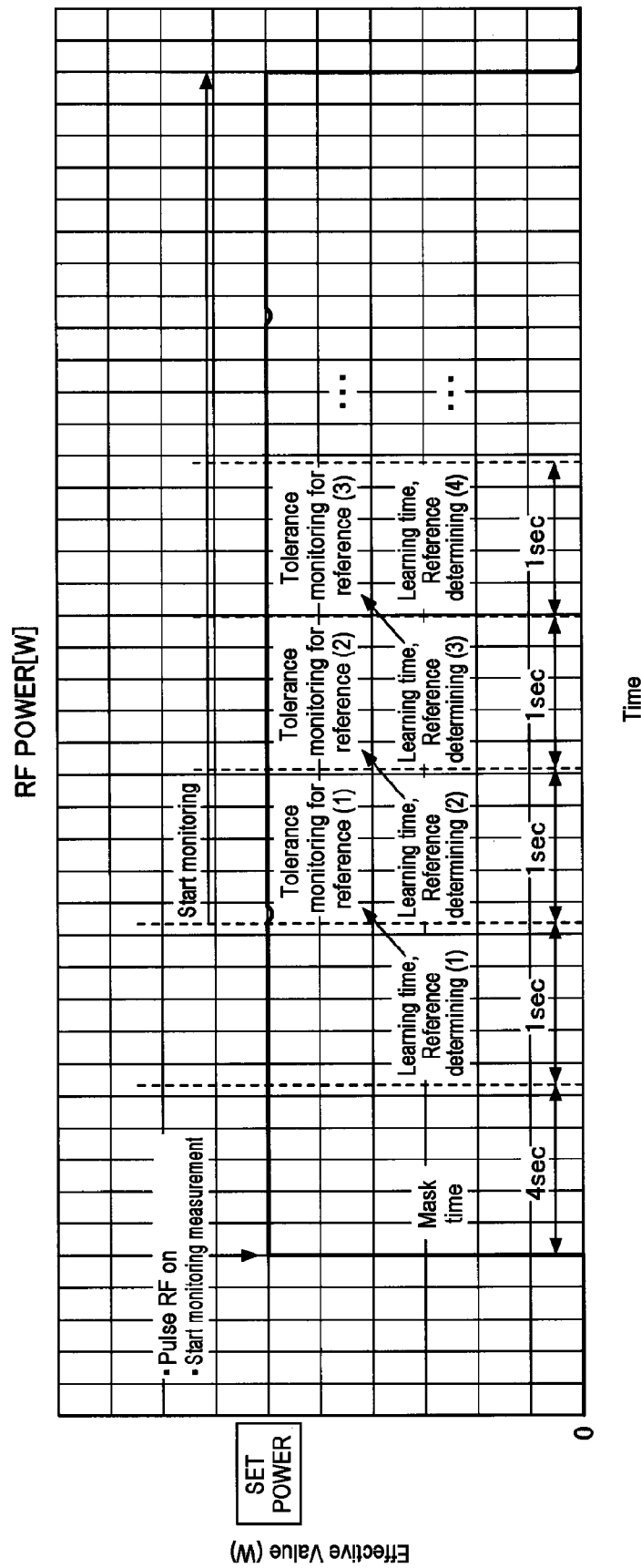
FIG. 6 is a view illustrating an operation of an example of the substrate processing apparatus according to the present embodiment.

Next, a flow of a monitoring process performed by an abnormality detection process will be described. FIG. 6 is a view illustrating a flow after starting monitoring by the abnormality detection process. In FIG. 6, the vertical axis represents an effective value of radio-frequency power (RF POWER (W)), and the horizontal axis represents time.

When the substrate processing apparatus 1 is used as a film forming apparatus, a plasma state is likely to change in a film forming process. Therefore, when a reference value for determining an abnormality is determined by an absolute value, the abnormality may not be determined correctly. In the substrate processing apparatus 1 according to the present embodiment, a reference value is obtained in a period before the abnormality determination is performed, and the determination is performed using the reference value. That is, abnormality detection is performed through the relative comparison of characteristic values in the immediately preceding period.

First, after the radio-frequency power supply 51 starts the supply of radio-frequency power, waiting is performed until the apparatus is stabilized (mask time). In this example, waiting is performed for 4 seconds as the mask time.

Then, in the next 1 second, learning (reference value learning) is performed to obtain a reference value for performing abnormality determination (learning time, reference determining (1)). After the reference determining is ended, monitoring is started.

Then, in the next 1 second, using the reference (1) (a reference value) obtained in the reference determining (1), it is determined whether or not a measured value is within a set range with respect to the reference value (tolerance monitoring) (tolerance monitoring for reference (1)). At the same time, learning to obtain the reference value in the next period (the next 1 second) (reference value learning) is performed (learning time, reference determining (2)).

Hereinafter, similarly, the tolerance monitoring and the reference value learning are repeated. In the above, the mask time is set to 4 seconds, and the learning time and the tolerance monitoring time are set to 1 second, but the times may be changed appropriately without being limited thereto.

For example, the first 1 second in the "learning time, reference determining (1)" is an example of the first period, and the 1 second in the "learning time, reference determining (2)" immediately after the 1 second in the "learning time, reference determining (1)" is an example of a second period. In addition, the 1 second in the "learning time, reference determining (2)" immediately after the 1 second in the "learning time, reference determining (2)" is an example of a third period. In addition, measured values (waveform indices to be described later), which are measured respectively in the first period, the second period, and the third period, are examples of the first waveform index, the second waveform index, and the third waveform index, respectively.

Next, a waveform index for evaluating a waveform and an abnormality detection method will be described. In the substrate processing apparatus 1 of the present embodiment, the intensity of a traveling wave (FWD), the intensity of a reflected wave (REF), a duty ratio (Pulse Duty), and the repetition frequency (Pulse Freq) are used as waveform indices. An abnormality is detected based on whether or not a waveform index is within a set range.

[Intensity of Traveling Wave (FWD)]

The intensity of the traveling wave (FWD) is the intensity of a traveling wave propagating from the radio-frequency power source 51 toward the processing container 2. Specifically, a signal SIG_RF_FWD obtained by converting each pulse corresponding to a signal SIG_PULSE into an effective value is integrated over time. Then, a converted effective value corresponding to the effective value is calculated by dividing the integrated value of the signal SIG_RF_FWD by time.

Figure 7:
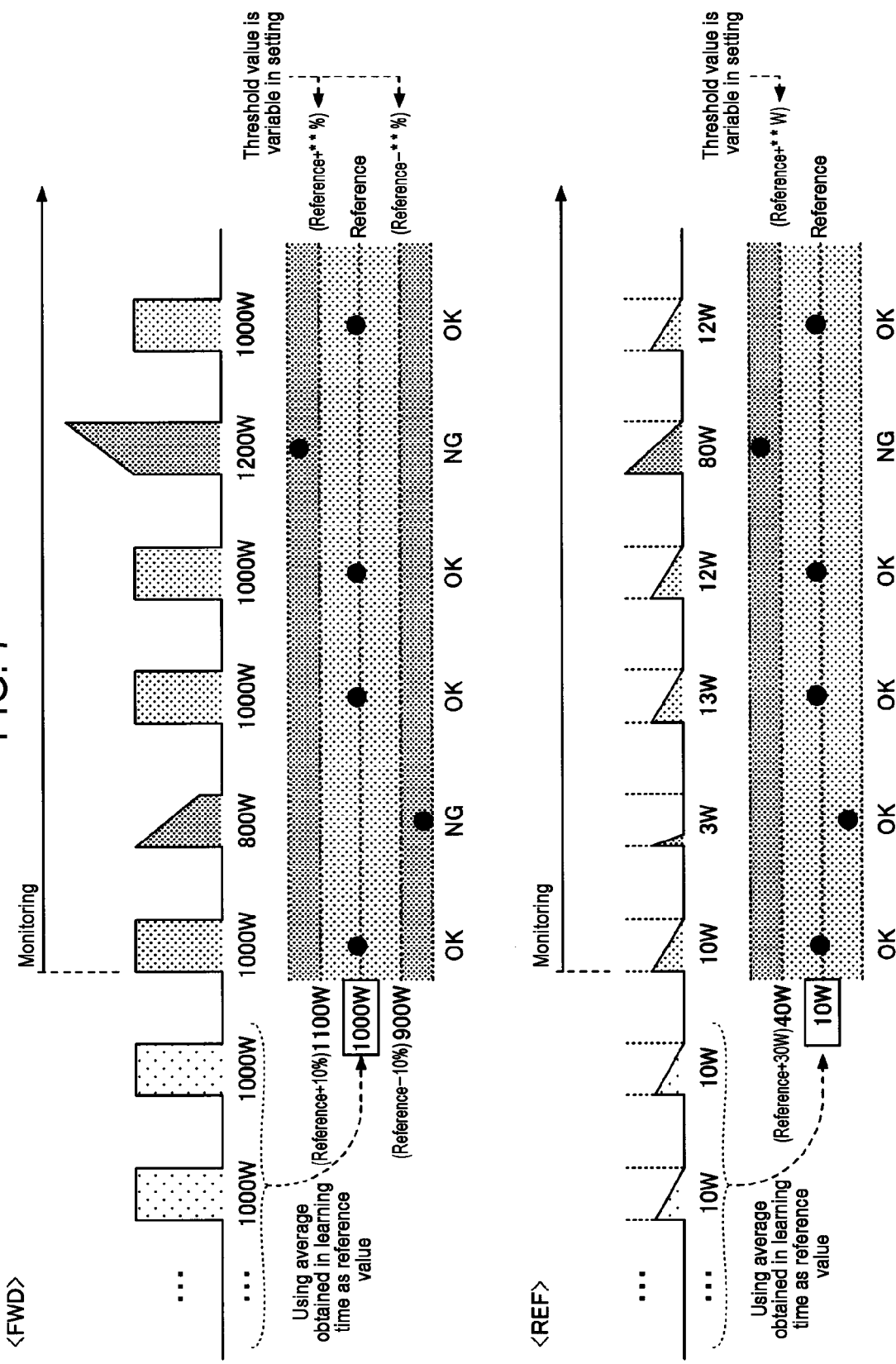
FIG. 7 is a view illustrating an operation of an example of the substrate processing apparatus according to the present embodiment.

As shown in <FWD> in FIG. 7, when an effective value becomes smaller or larger in a time direction, the converted effective value becomes smaller or larger.

For example, in a learning period before a monitoring period, an average value of converted effective values is calculated. Then, when a converted effective value is within the range of ±10% with reference to the average value of converted effective values, it is determined that the converted effective value is normal. For example, when the reference value is 1,000 W, it is determined whether or not the converted effective value of each pulse in the monitoring period is 900 W or more and 1,100 W or less. When the converted effective value is within the range, it is determined that the converted effective value is normal (OK). When the converted effective value is out of the range, it is determined that the converted effective value is abnormal (NG). In addition, the range is not limited to the range of ±10%, and, for example, a threshold value for defining the range may be changed in setting.

[Intensity of Reflected Wave (REF)]

The intensity of the reflected wave (REF) is the intensity of a reflected wave propagating from the processing container 2 toward the radio-frequency power supply 51. Specifically, a signal SIG_RF_REF obtained by converting each pulse corresponding to a signal SIG_PULSE into an effective value is integrated over time. Then, a converted effective value corresponding to the effective value is calculated by dividing the integrated value of the signal SIG_RF_REF by time.

As shown in <REF> in FIG. 7, when a reflected wave is large, a converted effective value becomes large.

For example, in a learning period before a monitoring period, an average value of converted effective values is calculated. Then, when a converted effective value is within the range of +30 W or less with reference to the average value of the converted effective values, it is determined that the converted effective value is normal. For example, when the reference value is 10 W, it is determined whether or not the converted effective value of each pulse in the monitoring period is 40 W or less. When the converted effective value is within the range, it is determined that the converted effective value is normal (OK). When the converted effective value is out of the range, it is determined that the converted effective value is abnormal (NG). In addition, the range is not limited to the range of +30 W or less, and, for example, a threshold value for defining the range may be changed in setting.

[Duty Ratio (Pulse Duty)]

The duty ratio (pulse duty) is a duty ratio of each pulse. Specifically, the width of a signal SIG_RF_FWD in a time direction is calculated for each pulse corresponding to a signal SIG_PULSE.

Figure 8:
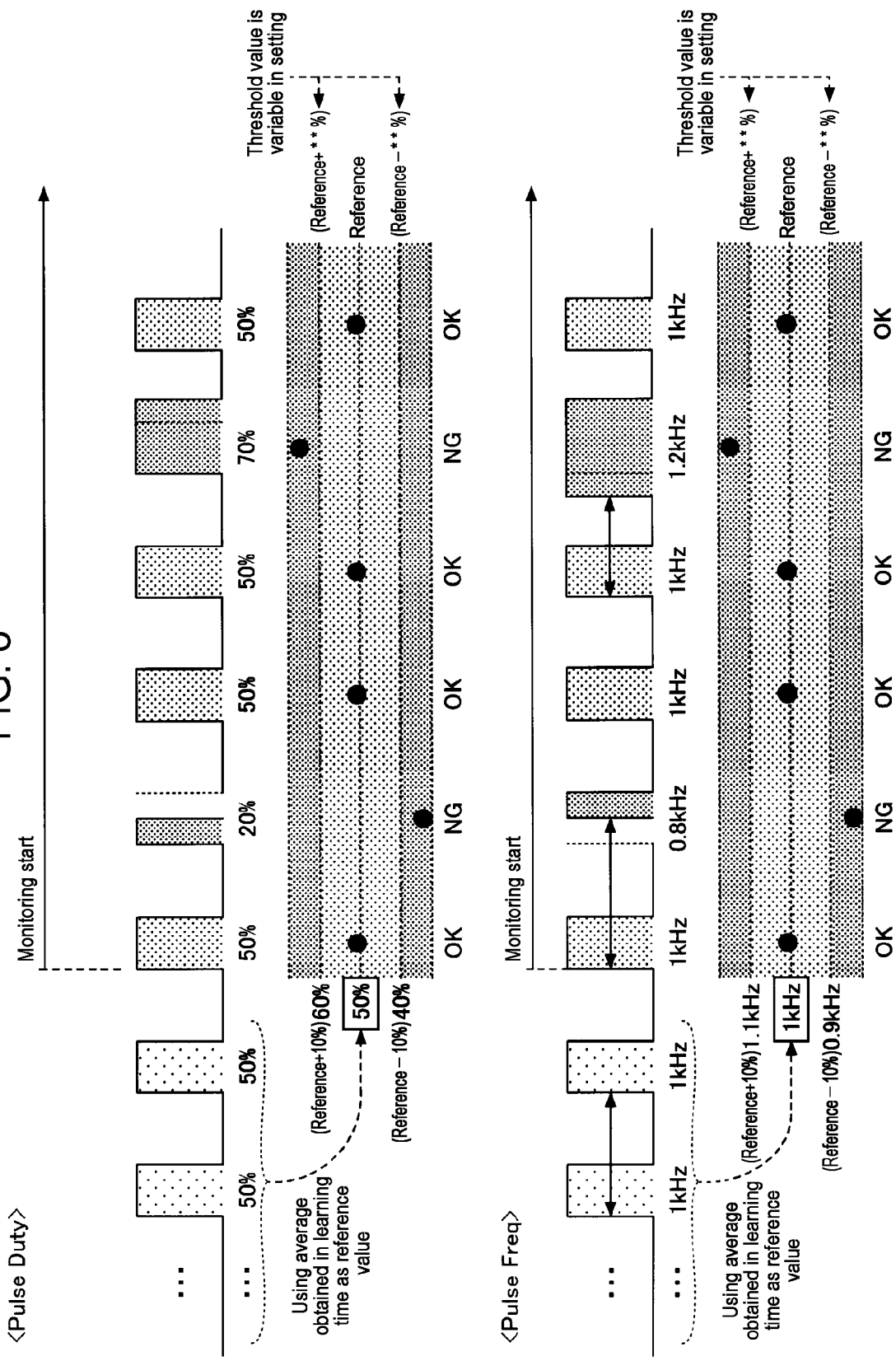
FIG. 8 is a view illustrating an operation of an example of the substrate processing apparatus according to the present embodiment.

As shown in <Pulse Duty> in FIG. 8, pulse widths may change and duty ratios may change.

For example, in a learning period before a monitoring period, the average value of duty ratios is calculated. When a duty ratio is within the range of ±10% with reference to the average value, it is determined that the duty ratio is normal. For example, when the reference value is 50%, it is determined whether the duty ratio of each pulse in the monitoring period is within the range of 40% or more and 60% or less. When the duty ratio is within the range, it is determined that the duty ratio is normal (OK). When the duty ratio is out of the range, it is determined that the duty ratio is abnormal (NG). In addition, the range is not limited to the range of 40% or more and 60% or less, and, for example, a threshold value for defining the range may be changed in setting.

[Repetition Frequency (Pulse Freq)]

The repetition frequency (Pulse Freq) is a repetition frequency of each pulse. Specifically, a repetition frequency of a signal SIG_RF_FWD is calculated for each pulse corresponding to a signal SIG_PULSE.

As shown in <Pulse Freq> in FIG. 8, pulses may change and repetition frequencies may change.

For example, in a learning period before a monitoring period, an average value of repetition frequencies is calculated. When a repetition frequency is within the range of ±10% with reference to the average value, it is determined that the repetition frequency is normal. For example, when the reference value is 1 kHz, it is determined whether or not the repetition frequency of each pulse in the monitoring period is within the range of 0.9 kHz or more and 1.1 kHz or less. When the repetition frequency is within the range, it is determined that the repetition frequency is normal (OK). When the repetition frequency is out of the range, it is determined that the repetition frequency is abnormal (NG).

In addition, the range is not limited to the range of 0.9 kHz or more and 1.1 kHz or less, and, for example, a threshold value for defining the range may be changed in setting.

The pulse monitor 100 includes a digital input and output. The controller 90 is connected to the pulse monitor 100. The controller 90 causes the pulse monitor 100 to execute a monitoring operation by a signal SIG_START. In addition, the pulse monitor 100 outputs an alarm signal to the controller 90. The alarm signal may be output, for example, when it is determined that any of the intensity of the traveling wave (FWD), the intensity of the reflected wave (REF), the duty ratio (Pulse Duty), and the repetition frequency (Pulse Freq) is abnormal. When the pulse monitor 100 outputs an alarm signal to the controller 90, the controller 90 can detect that an abnormality has occurred in the waveform.

In addition, the pulse monitor 100 is connected to a personal computer 200. The personal computer 200 receives data from the pulse monitor 100. For example, the personal computer 200 receives waveform information from the pulse monitor 100. In addition, for example, the personal computer 200 receives alarm information SIG_ALARM from the pulse monitor 100.

FIG. 9 shows examples of waveforms displayed on the personal computer 200. The line Lfwd indicates the waveform of the signal SIG_RF_FWD. The line Lref indicates the waveform of the signal SIG_RF_REF. Here, the waveform P2 is a waveform (abnormal waveform) determined by the pulse monitor 100 to be abnormal. The waveform P1 and the waveform P3 are waveforms before and after the waveform P2. By displaying the waveform P2 determined to be abnormal in the center and displaying normal waveforms before and after the waveform P2, an abnormal state can be easily determined.

In the personal computer 200, for example, a waveform may be displayed regardless of whether the waveform is normal or abnormal. In addition, when it is determined that the waveform is abnormal, signal data obtained by sampling the signal SIG_RF_FWD and the signal SIG_RF_REF may be saved as a file. By saving the signal data when it is determined that the waveform is abnormal, it is possible to analyze a trouble or the like. In addition, by saving the signal data when it is determined that the waveform is abnormal, it is possible to reduce the amount of data to be saved.

The combination of the substrate processing apparatus 1 and the personal computer 200 may be referred to as a substrate processing system 300. The radio-frequency power supply 51 is an example of a radio-frequency power supply part, the pulse monitor 100 is an example of a monitoring part, and the personal computer 200 is an example of a display terminal.

<Action/Effect>

With the substrate processing apparatus 1 according to the present embodiment, it is possible to detect an abnormality in the supply of radio-frequency power to the processing container.

The radio-frequency power of a pulse is used to adjust the plasma output of the substrate processing apparatus. In the related art, there was only a process log of about 100 ms in order to monitor whether or not radio-frequency power is being supplied to the processing container. In a plasma atomic layer deposition method, plasma is switched at high speed to form a film. In a film forming apparatus that switches plasma at high speed, the state of pulse waveforms on the order of microseconds also affects film formation.

Since the substrate processing apparatus 1 according to the present embodiment detects an abnormality based on signal data sampled at a sampling frequency higher than the frequency of radio-frequency power, it is possible to monitor the state of a pulse waveform on the order of microseconds. In addition, with the substrate processing apparatus 1, it is possible to monitor each waveform of a traveling wave propagating from the radio-frequency power supply part toward the processing container and a reflected wave propagating from the processing container toward the radio-frequency power supply part. By monitoring the waveform, it is possible to detect a more detailed abnormality.

In addition, since each waveform of each of a traveling wave propagating from the radio-frequency power supply part toward the processing container and a reflected wave propagating from the processing container toward the radio-frequency power supply part is monitored, it is possible to detect an abnormality such as arc discharge.

Further, with the substrate processing apparatus 1, it is possible to detect an abnormality in the duty ratio of radio-frequency power and the repetition frequency.

In addition, by learning the current state of the substrate processing apparatus 1, it is possible to relatively detect an abnormality from the learned information. By relatively detecting an abnormality, it is possible to detect the abnormality even in an environment in which a plasma state changes from moment to moment. In addition, it is possible to perform learning continuously while radio-frequency power is being supplied.

Furthermore, by monitoring a waveform to detect an abnormality, it is possible to prevent a substrate that has been subjected to substrate processing with an abnormal waveform from being sent to a subsequent process. By preventing the substrate that has been subjected to substrate processing with an abnormal waveform from being sent to the subsequent process, it is possible to prevent unnecessary processing in the subsequent process and to reduce the manufacturing cost.

The present disclosure provides a technique for detecting an abnormality in supply of radio-frequency power to a processing container.

It should be understood that the embodiments disclosed herein are exemplary in all respects and is not restrictive. The embodiments described above may be modified and improved in various forms without departing from the scope and spirit of the appended claims. The matters described in the aforementioned embodiments may have other configurations to the extent that they are not contradictory, and may be combined to the extent that they are not contradictory.

What is claimed is:

1. A substrate processing apparatus comprising:
    a radio-frequency power supply part configured to supply radio-frequency power for plasma generation to a processing container;
    a matcher provided between the radio-frequency power supply part and the processing container; and
    a monitoring part configured to detect an abnormality in the supply of the radio-frequency power to the processing container,
    wherein the radio-frequency power supply part includes a radio-frequency generator configured to generate the radio-frequency power and a bidirectional coupler provided between the radio-frequency generator and the matcher,
    wherein a portion of the radio-frequency power input from the radio-frequency generator to the bidirectional coupler as a first signal is output to the monitoring part, wherein the radio-frequency power input from the matcher to the bidirectional coupler as a second signal is output to the monitoring part, and wherein the monitoring part is configured to detect the abnormality in the supply of the radio-frequency power to the processing container based on signal data obtained by sampling a signal including the first signal and the second signal at a sampling frequency higher than a frequency of the radio-frequency power.

2. The substrate processing apparatus of claim 1, wherein the monitoring part is further configured to:
calculate, in a first period, a first waveform index, which is a waveform index of the signal, using the signal data;
calculate, in a second period immediately after the first period, a second waveform index, which is the waveform index, using the signal data; and
detect the abnormality based on comparison between the first waveform index and the second waveform index.

3. The substrate processing apparatus of claim 2, wherein the monitoring part is further configured to: detect, using the first waveform index as a reference value, the abnormality based on whether or not the second waveform index is within a set range with respect to the reference value.

4. The substrate processing apparatus of claim 3, wherein the monitoring part is further configured to:
calculate, in a third period immediately after the second period, a third waveform index, which is the waveform index, using the signal data; and
detect, using the second waveform index as the reference value, the abnormality based on whether or not the third waveform index is within the set range with respect to the reference value.

5. The substrate processing apparatus of claim 4, wherein the waveform index is one of an intensity of a traveling wave propagating from the radio-frequency power supply part toward the processing container, an intensity of a reflected wave propagating from the processing container toward the radio-frequency power supply part, a duty ratio, and a repetition frequency.

6. The substrate processing apparatus of claim 2, wherein the waveform index is one of an intensity of a traveling wave propagating from the radio-frequency power supply part toward the processing container, an intensity of a reflected wave propagating from the processing container toward the radio-frequency power supply part, a duty ratio, and a repetition frequency.

7. A substrate processing system comprising:
the substrate processing apparatus of claim 1; and
a display terminal
wherein the display terminal is configured to display an abnormal waveform in which an abnormality is detected in the signal data and waveforms before and after the abnormal waveform when the monitoring part detects the abnormality.

8. An abnormality detection method of detecting an abnormality in supply of radio-frequency power to a processing container of a substrate processing apparatus including a radio-frequency power supply part configured to supply radio-frequency power for plasma generation to the processing container and a matcher provided between the radio-frequency power supply part and the processing container, wherein the radio-frequency power supply part includes a radio-frequency generator configured to generate the radio-frequency power and a bidirectional coupler provided between the radio-frequency generator and the matcher,
the abnormality detection method comprising:
outputting a portion of the radio-frequency power input from the radio-frequency generator to the bidirectional coupler as a first signal;
outputting the radio-frequency power input from the matcher to the bidirectional coupler as a second signal; and
detecting the abnormality in the supply of the radio-frequency power to the processing container based on signal data obtained by sampling a signal including the first signal and the second signal at a sampling frequency higher than a frequency of the radio-frequency power.

* * * * *